United States Patent
Otremba et al.

(10) Patent No.: US 10,109,609 B2
(45) Date of Patent: Oct. 23, 2018

(54) CONNECTION STRUCTURE AND ELECTRONIC COMPONENT

(71) Applicant: Infineon Technologies Austria AG, Villach (AT)

(72) Inventors: Ralf Otremba, Kaufbeuren (DE); Josef Höglauer, Heimstetten (DE); Jürgen Schredl, Mering (DE); Xaver Schlögel, Sachsenkam (DE); Klaus Schiess, Allensbach (DE)

(73) Assignee: Infineon Technologies Austria AG, Villach (AT)

( * ) Notice: Subject to any disclaimer, the term of this patent is extended or adjusted under 35 U.S.C. 154(b) by 998 days.

(21) Appl. No.: 14/153,755

(22) Filed: Jan. 13, 2014

(65) Prior Publication Data
US 2015/0200178 A1    Jul. 16, 2015

(51) Int. Cl.
*H01L 23/00* (2006.01)
*H01L 23/556* (2006.01)
*H01L 23/552* (2006.01)

(52) U.S. Cl.
CPC ............ *H01L 24/29* (2013.01); *H01L 23/552* (2013.01); *H01L 23/556* (2013.01); *H01L 2224/29083* (2013.01); *H01L 2224/37147* (2013.01); *H01L 2224/40245* (2013.01); *H01L 2224/48247* (2013.01); *H01L 2224/73265* (2013.01); *H01L 2224/83801* (2013.01); *H01L 2224/84801* (2013.01); *H01L 2924/01103* (2013.01); *H01L 2924/13055* (2013.01); *H01L 2924/13091* (2013.01); *H01L 2924/181* (2013.01); *H01L 2924/2075* (2013.01); *H01L 2924/20751* (2013.01); *H01L 2924/3025* (2013.01)

(58) Field of Classification Search
CPC ....................................................... H01L 23/00
See application file for complete search history.

(56) References Cited

U.S. PATENT DOCUMENTS

| | | | |
|---|---|---|---|
| 4,481,526 A | 11/1984 | Miyasaka | |
| 4,580,157 A | 4/1986 | Honda | |
| 5,990,564 A | 11/1999 | Degani et al. | |
| 7,880,280 B2 | 2/2011 | Otremba | |
| 2013/0009295 A1* | 1/2013 | Otremba | H01L 23/49524 257/676 |

FOREIGN PATENT DOCUMENTS

| | | |
|---|---|---|
| DE | 102005044510 A1 | 3/2007 |
| DE | 102006003304 A1 | 3/2007 |
| DE | 102005054872 A1 | 5/2007 |
| DE | 102008006835 A1 | 9/2008 |
| EP | 0045561 B1 | 3/1987 |

* cited by examiner

*Primary Examiner* — Marvin Payen
(74) *Attorney, Agent, or Firm* — Murphy, Bilak & Homiller, PLLC

(57) ABSTRACT

A connection structure is provided that includes a semiconductor substrate, a first layer arranged on the semiconductor substrate, the first layer being configured to provide shielding against radioactive rays, a second layer arranged on the first layer, the second layer including solder including Pb, and an electrically conductive member arranged on the second layer.

25 Claims, 2 Drawing Sheets

CONNECTION STRUCTURE AND ELECTRONIC COMPONENT

BACKGROUND

An electronic component may include one or more semiconductor devices in a package. The package includes internal electrical connections from the semiconductor device to a substrate or a leadframe which includes outer contacts. The outer contacts are used to mount the electronic component on a redistribution board, such as a printed circuit board. The package may include a housing which covers the semiconductor device and the internal electrical connections.

SUMMARY

In an embodiment, a connection structure includes a semiconductor substrate, a first layer arranged on the semiconductor substrate, the first layer being configured to provide shielding against radioactive rays, a second layer arranged on the first layer, the second layer including solder including Pb and an electrically conductive member arranged on the second layer.

In an embodiment, an electronic component includes a semiconductor device, a first layer arranged on a first surface of the semiconductor device, the first layer being configured to provide shielding against radioactive rays, a second layer arranged on the first layer, the second layer including solder including Pb, and a first electrically conductive member arranged on the second layer.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
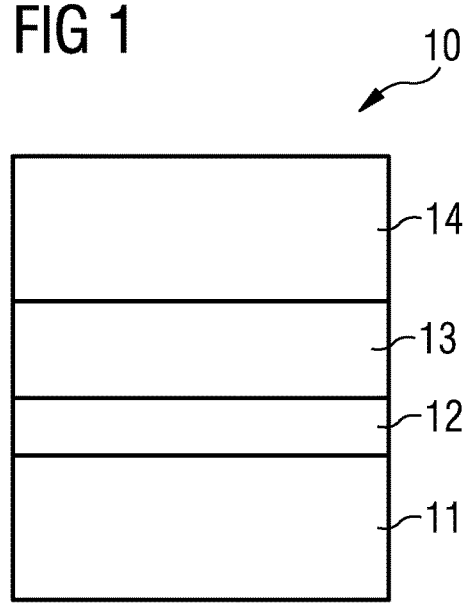
FIG. 1 illustrates a connection structure according to a first embodiment.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, the terms "coupled" and/or "electrically coupled" are not meant to mean that the elements must be directly coupled together-intervening elements may be provided between the "coupled" or "electrically coupled" elements.

As used herein, a "high-voltage device", such as a high-voltage depletion-mode transistor, is an electronic device which is optimized for high-voltage switching applications. That is, when the transistor is off, it is capable of blocking high voltages, such as about 300 V or higher, about 600 V or higher, or about 1200 V or higher, and when the transistor is on, it has a sufficiently low on-resistance (RON) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300 V, 600 V, 1200 V, or other suitable blocking voltage required by the application.

As used herein, a "low-voltage device", such as a low-voltage enhancement-mode transistor, is an electronic device which is capable of blocking low voltages, such as between 0 V and $V_{low}$, but is not capable of blocking voltages higher than $V_{low}$. $V_{low}$ may be about 10 V, about 20 V, about 30 V, about 40 V, or between about 5 V and 50 V, such as between about 10 V and 30 V.

FIG. 1 illustrates a connection structure 10 which includes a semiconductor substrate 11, a first layer 12 arranged on the semiconductor substrate 11, a second layer 13 arranged on the first layer 12 and an electrically conductive member 14 arranged on the second layer 13. The first layer 12 is configured to provide shielding against radioactive rays. The second layer 13 includes solder including the element lead (Pb).

Alternatively, or in addition to solder including Pb, the second layer 13 may include material emitting radioactive rays such as alpha particles, beta particles and/or gamma particles.

The first layer 12 may be used to shield the underlying semiconductor substrate 11 from radioactive rays, such as alpha particles, beta particles and gamma particles, which originate externally to the semiconductor substrate 11. The semiconductor substrate 11 may be an active semiconductor device, such as a transistor device, whose performance is adversely affected in the event that it is subjected to one or more radioactive rays. Radioactive rays may be emitted from materials within the connection structure, such as radioactive isotopes of impurity elements or compounds present in the Pb of the solder, or other materials external to the semiconductor substrate, such as the packaging materials of an electronic component including the semiconductor substrate, or external to the electronic component, for example, from the environment.

The first layer 12 may be used to assist in improving the long term stability of a semiconductor device by providing shielding against radioactive rays, for example against sources of alpha particles having an energy of greater than around 5 MeV and a long half-life. The first layer 12 may be arranged directly on the semiconductor substrate 11 and may cover active device components within the semiconductor substrate 11.

The first layer 12 may be configured to provide shielding against radioactive rays in different ways. In some embodiments, the first layer 12 includes a material which provides shielding against alpha particles. The first layer may include material having an electron density of at least $60 \cdot E^{27}$ $m^{-3}$ in order to provide shielding against radioactive rays and, in particular, alpha particles. The first layer may include one or more of the group consisting of aluminium, titanium, nickel, copper, magnesium and manganese in order to provide shielding against alpha particles and, optionally, other radioactive rays, such as beta rays.

The thickness of the first layer 12 may also be selected in order to provide effective shielding against radioactive rays. The some embodiments, the first layer 12 has a thickness of between 1 μm and 20 μm. In some embodiments, the first layer 12 has a thickness of at least 5 μm or at least 10 μm. In some embodiments, the first layer 12 includes nickel and/or copper and has a thickness of at least 5 μm or at least 10 μm.

The first layer 12 may include a multilayer structure. For example, the multilayer structure may include alternating sublayers of nickel and copper. The sublayers may each have a thickness of around 1 μm.

The solder may be a lead (Pb)-based solder such as 60/40 Sn/Pb or 63/37 Sn/Pb or may include lower proportion of lead, such as $Sn_{95}Pb_5$ or $Sn_{62}Pb_{36}Ag_2$. In some embodiments, the solder further includes tin and silver.

The connection structure 10 may further include a third layer arranged between the second layer 13 and the conductive member 14. The third layer may be configured to promote adhesion between the second layer, and in particular, between the solder of the second layer 13 and the electrically conductive member 14. The third layer may include at least one of silver and nickel.

The electrically conductive member may include a metal or an alloy. In some embodiments, the electrically conductive member includes copper.

The connection structure according to any one of these embodiments may be used in an electronic component including a semiconductor substrate in the form of a semiconductor device having active components.

The first layer 12 of the connection structure 10 may provide at least a portion of a front side metallization structure of the semiconductor device and/or at least a portion of a rear side metallization structure of the semiconductor device. For example, some or all of an aluminium metallization structure may be replaced by an element having a higher electron density, for example by copper or nickel, and/or the thickness of the metallization may be increased to provide better shielding against radioactive rays. In some embodiments, the metallization structure is modified in only those regions on which a Pb-containing solder layer is to be positioned, for example, for one or more of the current electrodes of a transistor device.

The electrically conductive member may be a die pad, for example of a leadframe or the electrically conductive member may be a contact clip for electrically coupling a contact pad of the semiconductor device to a lead of the electronic component.

In some embodiments, an electronic component includes two or more connection structures. For example, a connection structure may be arranged on the upper surface of a vertical transistor in order to electrically couple a current electrode, such as a source electrode, to a lead by a contact clip and the second connection structure may be provided between the opposing lower side of the semiconductor device to attach the semiconductor device to die pad portion of a leadframe and to electrically couple a drain electrode arranged at the lower surface of the semiconductor device to the die pad.

The semiconductor device may be a transistor device such as a Metal Oxide Semiconductor Field Effect Transistor (MOSFET), an Insulated Gate Bipolar Transistor (IGBT) or a Bipolar Junction Transistor (BJT) and may be a high-voltage device or low voltage device.

Figure 2:
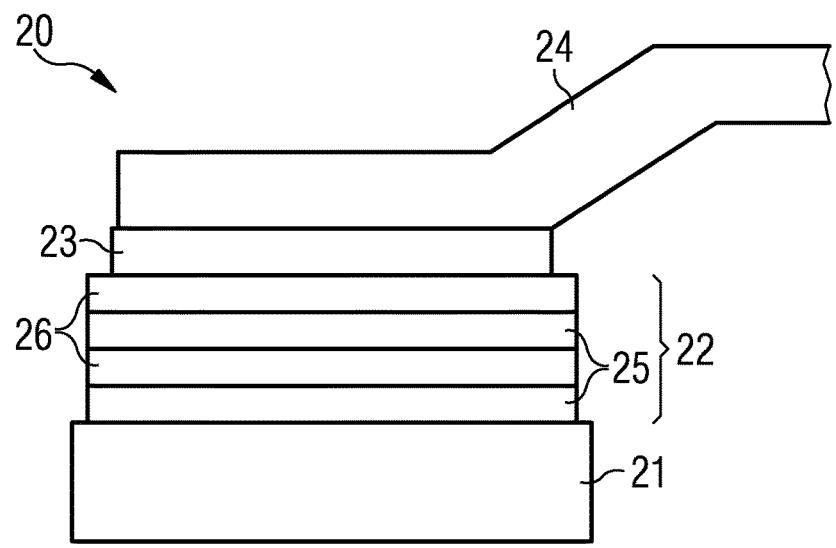
FIG. 2 illustrates a connection structure according to a second embodiment.

FIG. 2 illustrates a connection structure 20 according to a second embodiment. The connection structure 20 includes a semiconductor substrate 21 which may be a semiconductor device such as a high-voltage transistor device. The connection structure 20 further includes a first layer 22 configured to shield the semiconductor substrate 21 from radioactive rays, a second layer 23 including a soft solder that includes Pb and an electrically conductive member 24 in the form of a copper contact clip. The electrically conductive member 24 is electrically coupled to the semiconductor substrate 21 by the second solder containing layer 23 which is arranged between the electrically conductive member 24 and the first layer 22.

In this embodiment, the first layer 22 includes a multilayer structure and includes first sublayers 25 of nickel interleaved by second sublayers 26 of copper. Each of the sublayers 25, 26 may have a thickness of around 1 μm and the number of sublayers 25, 26 may be selected to produce a first layer 22 with a total thickness of between 2 μm and 20 μm.

Figure 3:
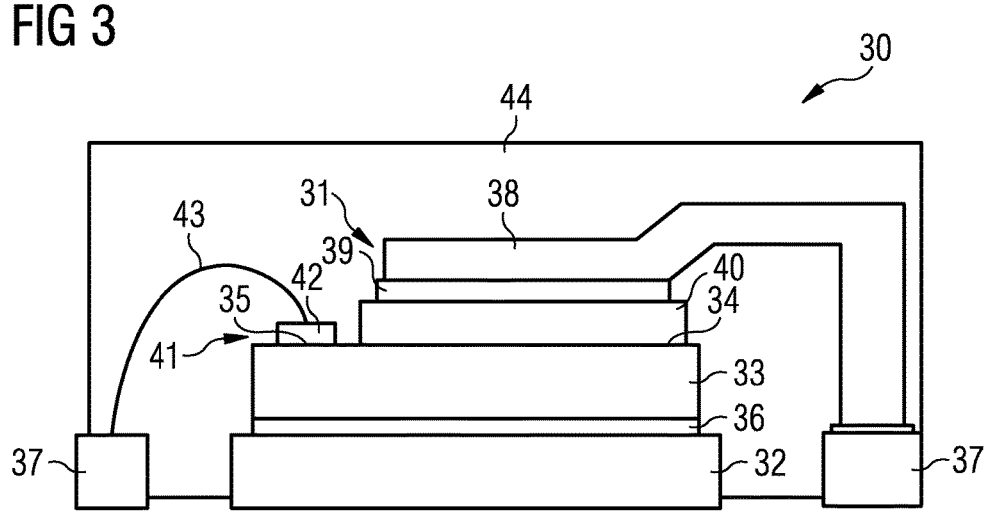
FIG. 3 illustrates an electronic component including a connection structure.

FIG. 3 illustrates an electronic component 30 including a connection structure 31. The electronic component 30 includes a die pad 32 on which a semiconductor device 33 is mounted. In this particular embodiment, the semiconductor device 33 is a vertical MOSFET transistor including a source 34 and a gate 35 on its upper surface and a drain 36 at its lower surface. The drain 36 is mounted on, and electrically coupled to, the die pad 32. The electronic component 30 further includes a plurality of leads 37 arranged adjacent two opposing side faces of the die pad 32.

The source 34 of the semiconductor device 33 is electrically coupled to a lead 37 by a contact clip 38. The contact clip 38 is attached to the source 34 by a solder connection 39 extending between the contact clip 38 and a contact pad 40 which is electrically coupled to the source 34. The contact pad 40 includes a material and a thickness configured to shield the underlying region of the semiconductor device 33 from radioactive rays emanating from outside of the semiconductor device 33 and the contact pad 40.

The connection structure 31 includes the semiconductor device 33, a portion of the front side metallization 41 providing the source contact pad 40, the solder connection 39 and the contact clip 38.

The front side metallization 41 of the semiconductor device 33 has been modified such that the source contact pad 40 includes a material and a thickness suitable for providing shielding against radioactive rays, in particular, alpha particles. The gate pad 42 is electrically coupled to a lead 37 by bond wire 43 and may have a smaller thickness that the source contact pad 40.

In embodiments in which the solder connection 39 includes Pb, the Pb may include alpha particle emitting materials in the form of small amounts of radioactive isotopes of, for example, uranium. By arranging the contact pad 40 providing a shielding layer 40 between the Pb-containing solder 39 and the semiconductor device 33, the contact pad 40 can provide protection for the semiconductor device 33 against a possible emission of an alpha particle from the solder connection 39. The contact pad may assist in increasing the operational life time of the device. Additionally, the contact pad 40 is able to provide protection for the semiconductor device 33 against radioactive rays from other sources, for example the encapsulation material 44 providing the housing of the electronic component 30 or from the environment. The contact pad 40 may be arranged directly on active components of the semiconductor device 33 to better shield these active components from radioactive rays.

Figure 4:
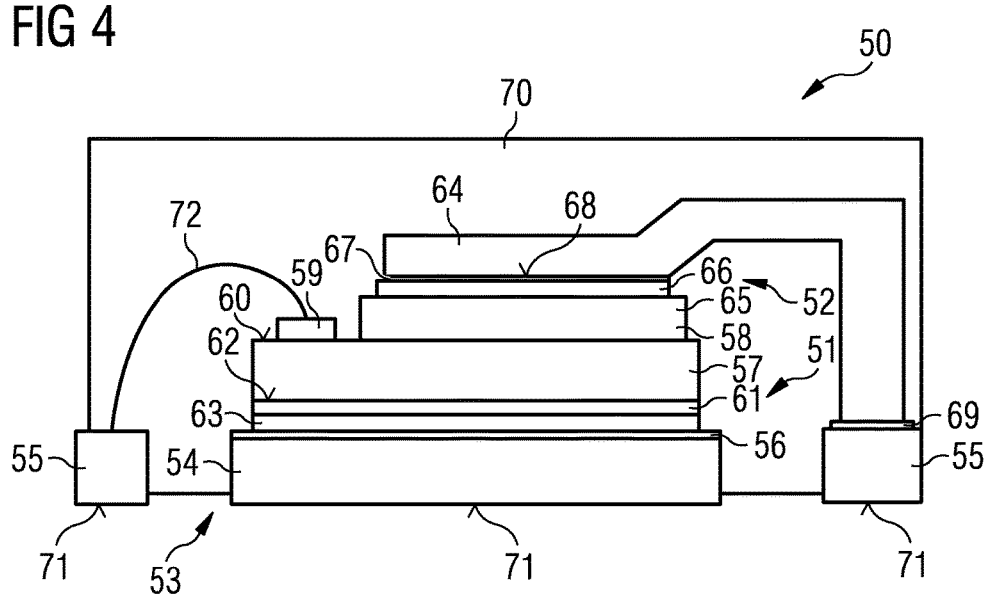
FIG. 4 illustrates an electronic component including two connection structures.

FIG. 4 illustrates an electronic component 50 including two connection structures 51, 52. The two connection structures 51, 52 may be same or may differ. The electronic component 50 includes a leadframe 53 including a die pad 54 and a plurality of leads 55 arranged adjacent and spaced apart from two opposing side faces of the die pad 54.

The leadframe 53 includes copper and includes a layer 56 of silver and/or nickel on the upper surface of the die pad 54 and the leads 55 in order to provide good adhesion to soft solder and, in particular, a soft solder including Pb. The electronic component 50 further includes a semiconductor device 57 in the form of a vertical MOSFET device. The semiconductor device 57 includes a source pad 58 and a gate pad 59 on its upper surface 60 and a drain pad 61 on its lower surface 62.

The drain pad 61 is mounted on, and electrically coupled to, the die pad 54 by a first connection structure 51 which includes a first layer 61 configured to provide shielding against radioactive rays. The first layer 61 of the connection structure provides the drain pad 61 and may be considered as the rear side metallization of the semiconductor device 57. The first connection structure 51 further includes a layer 63 of soft solder which includes lead (Pb), tin (Sn) and silver (Ag). The layer 63 of soft solder is arranged between the drain pad 61 and the die pad 54. The die pad 54 provides an electrically conductive member of the first connection structure 51.

The source pad 58 is electrically coupled to a lead 55 of the leadframe 53 by a contact clip 64 and the second connection structure 52. The second connection structure 52 includes a first layer 65 arranged on the semiconductor device 57. The first layer 65 is configured to provide shielding against radioactive rays and provides the source pad 58. The connection structure 52 further includes a layer 66 of a lead (Pb), tin (Sn) and silver (Ag)-containing solder which is arranged between the contact clip 64 and the first layer 65 and which electrically couples the source pad 58 to the contact clip 64.

The second connection structure 52 further includes a layer of nickel and/or silver 67 arranged on the lower surface 68 of the contact clip 64. The contact clip may include copper. The layer of nickel and/or silver 67 may be used to improve the wettability of the contact clip 54 to the layer 66 including solder.

The contact clip 64 is mounted on the lead 55 by a layer of solder 69 which includes lead, tin and silver may have the same composition as the layers 63, 66 including solder of the first and second connection structures 51, 52. As the first layer 65 of the second connection structure 52 provides the source pad 58, the second connection structure 52 can be considered to provide at least a portion of the front side metallization of the semiconductor device 57.

The gate pad 59 is electrically coupled to a lead 55 of the leadframe 53 by a bond wire 72. The gate pad 59 may include the same material as the source pad 58 or the material may differ. The thickness of the gate pad 59 may also be the same or be less than the thickness of the source pad 58. Using the same material and thickness for the gate pad 59 and for the source pad 58 may assist in simplifying the production of the front side metallization.

If the soft solder is likely to include alpha particle emitting material and soft solder is not arranged on the gate pad 59, the gate pad my not be required to provide shielding against radioactive rays. In these embodiments, the gate pad 59 may have a smaller thickness and/or a material with a lower electron density than the source pad 58.

The drain pad 61 and the source pad 58 are both configured to provide shielding against radioactive rays and, in particular, alpha particles. The drain pad 61 and the source pad 58 include a material such as nickel or copper which has an electron density sufficient to shield the active device structures of the semiconductor device 57 from radioactive rays originating from outside of the semiconductor device 57. The thickness of the source pad 58 and the drain pad 61 may also be selected, in combination with the material providing the source pad 58 and drain pad 61 to provide sufficient shielding.

The source pad 58 and the drain pad 61 may each have a thickness of 1 µm to 20 µm. The solder layers 66, 63 may each have a thickness of 1 µm to 100 µm, the silver and/or nickel layers 56, 67 may each have a thickness of between 0.1 µm and 10 µm. The copper leadframe 53 may have a thickness of 100 µm to 1000 µm. Silicon of the semiconductor body 57 may have a thickness of between 10 µm to 100 µm or 20 µm to 40 µm.

The first connection structure 51 and the second connection structure 52 have the same arrangement with respect to the semiconductor device 57. The order of the layers of the respective connection structures 51, 52 from top to bottom of the stack is reversed.

The electronic component 50 also includes a housing 70 in the form of an epoxy resin which covers the contact clip 64, the semiconductor device 57 and the upper portions of the leadframe 53. The lower surfaces 71 of the die pad 54 and of the leads 55 remain exposed from the housing 70 and provide outer contacts for the electronic component 50.

In the embodiment illustrated in FIGS. 3 and 4, a plurality of leads is arranged adjacent two opposing side faces of the die pad. However, the electronic component not limited to this arrangement. For example, the leads may be arranged adjacent a single side face or adjacent four side faces of the die pad.

The first layer of the first connection structure and/or the first layer of the second connection structure may include a multi-layer structure. For example, the first layer of the first connection structure and/or the first layer of the second connection structure may include alternating sublayers of Ni and Cu which in total have a thickness sufficient to provide shielding for the active regions of the semiconductor device against alpha particles.

The electronic component may also include more than one semiconductor device. For example, the electronic component 50 may include two transistor devices which may be configured in a half-bridge arrangement. The electronic component 50 may include a transistor device and a diode, for example an IGBT and a free-wheeling diode. The electronic component 50 may include one or more transistor devices and a logic device, such as a controller, a gate driver etc.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A connection structure, comprising:
   a semiconductor substrate;
   a first layer arranged on the semiconductor substrate, the first layer being configured to provide shielding against radioactive rays;
   a second layer arranged on the first layer, the second layer comprising solder comprising Pb; and
   an electrically conductive member arranged on the second layer.

2. The connection structure according to claim 1, wherein the first layer comprises material that provides shielding against alpha particles.

3. The connection structure according to claim 1, wherein the first layer comprises material having an electron density of at least 60 $E^{27}$ m$^{-3}$.

4. The connection structure according to claim 1, wherein the first layer comprises one or more materials selected from the group consisting of Al, Ti, Ni, Cu, Mg and Mn.

5. The connection structure according to claim 1, wherein the first layer has a thickness of between 1 μm and 20 μm.

6. The connection structure according to claim 1, wherein the first layer comprises a multi-layer structure.

7. The connection structure according to claim 6, wherein the multi-layer structure comprises alternating sublayers of Ni and Cu.

8. The connection structure according to claim 7, wherein the sublayers each have a thickness of around 1 μm.

9. The connection structure according to claim 1, wherein the electrically conductive member comprises a metal or an alloy.

10. The connection structure according to claim 1, wherein the solder further comprises tin and silver.

11. The connection structure according to claim 1, further comprising a third layer arranged between the second layer and the electrically conductive member, the third layer being configured to promote adhesion between the second layer and the electrically conductive member.

12. The connection structure according to claim 11, wherein the third layer comprises at least one of Ag and Ni.

13. An electronic component, comprising:
    a semiconductor device;
    a first layer arranged on a first surface of the semiconductor device, the first layer being configured to provide shielding against radioactive rays;
    a second layer arranged on the first layer, the second layer comprising solder comprising Pb; and
    a first electrically conductive member arranged on the second layer.

14. The electronic component according to claim 13, wherein the first layer provides at least a portion of a front side metallization structure of the semiconductor device.

15. The electronic component according to claim 13, wherein the first layer provides at least a portion of a rear side metallization structure of the semiconductor device.

16. The electronic component according to claim 13, wherein the first electrically conductive member comprises a die pad.

17. The electronic component according to claim 13, wherein the first electrically conductive member comprises a contact clip.

18. An electronic component, comprising:
    a semiconductor device;
    a first layer arranged on a first surface of the semiconductor device, the first layer being configured to provide shielding against radioactive rays;
    a second layer arranged on the first layer, the second layer comprising solder comprising Pb;
    a first electrically conductive member arranged on the second layer;
    a third layer arranged on a second surface of the semiconductor device, the third layer being configured to provide shielding against radioactive rays;
    a fourth layer arranged on the third layer, the fourth layer comprising solder comprising Pb; and
    a second electrically conductive member arranged on the fourth layer.

19. The electronic component according to claim 13, wherein the semiconductor device is one of a MOSFET, IGBT and BJT.

20. The electronic component according to claim 18, wherein the first and third layers provide at least a portion of one or more of a front side or a rear side metallization structure of the semiconductor device.

21. The electronic component according to claim 18, wherein the first and/or second electrically conductive members comprise die pads.

22. The electronic component according to claim 1, wherein a thickness of the first layer is between 5 μm and 10 μm.

23. The electronic component according to claim 1, wherein the second layer comprises one or more of 60/40 Sn/Pb, 63/37 Sn/Pb, $Sn_{95}Pb_5$, and $Sn_{62}Pb_{36}Ag_2$.

24. The electronic component according to claim 23, wherein the second layer further comprises tin and/or silver.

25. The electronic component according to claim 1, wherein the second layer comprises a soft solder.

* * * * *